United States Patent
Adamo

(10) Patent No.: US 10,082,569 B1
(45) Date of Patent: Sep. 25, 2018

(54) ANTENNA STATUS REMOTE MONITORING SYSTEM

(71) Applicant: FIRECOM, INC., New York, NY (US)

(72) Inventor: Patrick Adamo, Smithtown, NY (US)

(73) Assignee: FIRECOM, INC., New York, NY (US)

( * ) Notice: Subject to any disclaimer, the term of this patent is extended or adjusted under 35 U.S.C. 154(b) by 0 days.

(21) Appl. No.: 15/636,431

(22) Filed: Jun. 28, 2017

(51) Int. Cl.
  G08B 13/14   (2006.01)
  G01S 13/75   (2006.01)
  H01Q 1/22    (2006.01)
  H01Q 3/26    (2006.01)
  G01R 31/08   (2006.01)
  G06K 7/10    (2006.01)
  H01Q 1/38    (2006.01)
  G06K 7/00    (2006.01)

(52) U.S. Cl.
  CPC ........... G01S 13/753 (2013.01); G01R 31/08 (2013.01); G01S 13/758 (2013.01); G06K 7/0008 (2013.01); G06K 7/10336 (2013.01); H01Q 1/2208 (2013.01); H01Q 1/38 (2013.01); H01Q 3/267 (2013.01)

(58) Field of Classification Search
  CPC ..... G01S 13/753; G01S 13/758; G01R 31/08; G06K 7/0008; G06K 7/10336; H01Q 1/2208; H01Q 1/38; H01Q 3/267
  USPC ........................................ 340/572.1
  See application file for complete search history.

(56) References Cited

U.S. PATENT DOCUMENTS

| | | | |
|---|---|---|---|
| 5,946,373 A | 8/1999 | Harris | |
| 7,224,170 B2* | 5/2007 | Graham | H01Q 3/267 |
| | | | 324/522 |
| 7,480,494 B2* | 1/2009 | Ukai | H04B 1/0466 |
| | | | 455/117 |
| 8,254,848 B1* | 8/2012 | Elliott | H04B 7/022 |
| | | | 370/242 |
| 2002/0093453 A1 | 7/2002 | Vail et al. | |
| 2003/0072121 A1 | 4/2003 | Bartel et al. | |
| 2006/0145884 A1 | 7/2006 | Graham et al. | |

FOREIGN PATENT DOCUMENTS

WO   2016009327 A1   1/2016

OTHER PUBLICATIONS

International Searching Authority, Notification of Transmittal of the International Search Report and The Written Opinion of the International Searching Authority (in PCT Application No. PCT/US2017/039794), dated Sep. 7, 2017.

* cited by examiner

*Primary Examiner* — Kerri McNally
(74) *Attorney, Agent, or Firm* — Cooper & Dunham LLP

(57) ABSTRACT

A system for remote monitoring a network of distributed antennas. The system including at least one antenna electrically coupled to a radio-frequency (RF) transmission line, and a monitoring module electrically coupled to the RF transmission line, the monitoring module configured to receive a direct-current (DC) coded signal via the RF transmission line and compare the DC coded signal to at least one code saved in a memory of the monitoring module to determine a status associated with the at least one antenna.

6 Claims, 9 Drawing Sheets

ANTENNA STATUS REMOTE MONITORING SYSTEM

FIELD

Embodiments of the invention relate to an antenna monitoring system, and more specifically, to an antenna monitoring unit used in a distributed antenna monitoring system that allows for self-diagnosis to determine if an associated antenna is currently functional and connected to the system.

BACKGROUND

The inventor of the present application, Patrick Adamo, believes that certain inventions disclosed and/or claimed in one or more applications naming Marek E. Antkowiak of Lake Hopatcong, N.J., Perry Sanche of Langley, BC, CANADA, and Richard Smith of Carrollton, Tex. as inventors, including a provisional application filed on Jun. 28, 2016, a copy of which is attached hereto as Appendix A and incorporated by reference herein in its entirety, and a non-provisional application potentially filed on Jun. 28, 2017, were derived from him and were filed without his authorization.

In urban high-rise buildings constructed of concrete and steel, traditional public safety communications systems such as police and fire radio systems as well as cellular radio systems are often unable to effectively receive or transmit voice and data communications throughout the building from radio sources outside the building. Typical dead zones include stairwells and other similar spaces that are enclosed on all sides by steel reinforced structure. The existence of wireless "dead zones" in a communications network can have fatal consequences when there is a fire or other emergency condition within the building and emergency personal within the building cannot be contacted.

The Sep. 11, 2001 attacks on the World Trade Center in New York City and the resulting deaths of civilians and emergency personnel are a particular example of the problems with a deficient communications infrastructure. Point to point communications systems were not able to meet the challenges of maintaining communications between a command station at the base of a building with fire crews that were 50 stories up in the structure. As a result, many jurisdictions have enacted ordinances that require new and retrofitted commercial buildings to install systems that ensure radio coverage for public safety signals within the building as a condition of occupancy. Nationwide model codes have been developed that address public safety for in-building communications.

As one example, the New York City Building Code requires, in Sections 403.4.4 and 907.2.13.2, that an in-building auxiliary radio communication (ARC) system be installed and maintained in all newly-constructed high-rise buildings. An ARC system is a wireless two-way building communication system for Fire Department use only that receives and transmits Fire Department portable radio frequencies within the building. An ARC system will typically include a transceiver (e.g., a base station) connected to a building-wide distributed antenna system, with a radio console in the building lobby. Section 917.1.2 of the New York City Building Code and Section FC 511 of the New York City Fire Code together require that ARC systems be installed, that they be tested, and that they be operated and maintained in accordance with the Fire Code and the rules of the Fire Department.

These improvements in the implementation and, very importantly the monitoring of these systems provide a significant benefit to the robustness of hand held wireless communication systems. However, it has been determined that it is common to have installed ARC cables and components damaged for example, during construction and renovation. Without proper monitoring, damage to the ARC system could go unnoticed causing communications disruptions within the structure, increasing the potential for serious injury or death when that system was required during an emergency.

The Fire Department of New York City mandated new rules for ARC systems that require periodic monitoring of all the elements of a Radio Frequency Distributed Antenna System (RF-DAS). The requirements provide that, while in standby, the RF-DAS should perform a periodic self-test to assure proper performance when the system is needed in an actual emergency. Fire Department rules also establish requirements for the design, installation, operation and maintenance of ARC systems. These rules include testing procedures necessary to confirm that the ARC system is providing adequate radio coverage in the building in all areas accessible for firefighting operations. The rules seek to ensure that ARC systems achieve their intended purpose and, once installed, are continuously maintained in good working order.

One system that has sought to ensure the proper functioning of the distributed antenna system throughout a structure is U.S. Pat. No. 7,224,170 entitled "Fault Monitoring in a Distributed Antenna System." The '170 patent describes a central monitoring unit and a plurality of antennas coupled to the central monitoring unit through a network. Each antenna includes an antenna monitoring unit, which determines whether the associated antenna is properly connected to the network. To accomplish this, the antenna monitoring unit includes a measurement circuit for measuring a current drawn by its associated antenna and a reporting component for outputting a status message to the central monitoring unit. The current drawn by the antenna is measured and compared against a reference level. The measured level of current drawn by the antenna is indicative of whether the antenna is properly connected.

However, the '170 patent teaches use of a system where the fault monitoring communication path to the antenna network is not isolated from the antenna signal path. For example, with reference to FIG. 2 the antenna is directly connected to the main signal line and extends to the "Wireless Base Station." There is no DC isolation of the antenna to the central monitoring unit. While the '170 patent discloses that two-way communication to the antenna monitoring unit 22 is possible, it teaches that the communication is in the form of "low frequency signals." The '170 patent then goes on to broadly state that the system could include system "which carry RF and status signal, in digital or analog format." However, the monitoring circuit in '170 is not capable of using a digital signal to transmit information due to the lack of any DC isolation of the antenna. Additionally, with reference to FIG. 2, the '170 patent is focused on a grounded type antenna.

As stated above, the '170 patent uses "low frequency signals." As a design requirement, diagnostic monitoring of the RF-DAS system cannot emit RF signals in the already RF noisy urban environment. Additionally, the monitoring should be able to locate any non-functioning elements, right to and including the antenna itself. The system should use the RF Transmission lines and not require other external wires or wireless devices.

SUMMARY

An embodiment of the present invention can provide a system for remote monitoring a network of distributed antennas. The system can include at least one antenna electrically coupled to a radio-frequency (RF) transmission line, and a monitoring module electrically coupled to the RF transmission line. The monitoring module can be configured to receive a direct-current (DC) coded signal via the RF transmission line and compare the DC coded signal to at least one code saved in a memory of the monitoring module to determine a status associated with the at least one antenna.

An antenna allows for diagnosis to determine if the antenna is currently functional and connected to the system regardless of the RF signals which may or may not be present in the antenna.

An antenna that allows for monitoring of the antenna up to and including the antenna.

An antenna allows for digital signals to be sent to and from a monitoring device using the main RF signal line utilized by the antenna.

An antenna and monitoring device that permits locating any non-functioning elements, right to and including the antenna itself, and does not require other external wires or wireless devices.

The above-listed objects are achieved in one configuration, where an antenna unit is connected in series with a fault detection circuit, which is in turn, connected to an RF signal path. The fault detection circuit comprises a capacitor connected in series with the RF signal path and the antenna, and an inductor in series with a resistor (IR) connected between the RF signal path and ground at the antenna location. The IR branch of the fault detection circuit is provided to create a DC current path up to the antenna itself.

The invention further incorporates a DC master controller that is connected to a remote monitor, and the remote monitor uses a DC signal to monitor the antenna. The combination of components enables DC monitoring of all cables from a RF transmitter unit to each antenna, and even of the antenna itself.

The logic of the monitoring device comprises a closed circuit current loop or a dual loop system where a constant resistance is measured into the antenna that is considered a "normal" state. Values that vary from the known value would be considered a state of alarm. A secondary resistive value could be used to determine a change of alarm state based on some change of condition. In the case where a thermistor might be used along with the resistor or on its own, the current and/or the voltage could vary based on the specific task that thermistor may be asked to perform. A transducer could be used in cases where a varying state could be monitored, an example of which could be a rise or reduction in temperature, a measured RF value or any condition that is variable. In some instances, the logic could be positioned inside the antenna housing or structure in an analog or digital format.

In some configurations, the master controller transmits a DC coded signal through multiple RF transmission lines to multiple antennas. Each remote monitor associated with an antenna, is identified by a unique code and responds when polled with its unique code by the master controller to confirm the ready status of the polled antenna.

It should be understood, however, that the logic may constantly or periodically measure the state of the system directly into the antenna(s) providing a comprehensive view of the system's ability to function normally. Additionally, the remote monitor could be provided to communicate information locally (red lights or a siren for example) or to a monitoring entity (for dispatch as an example) or text or email messages to concerned parties.

For this application the following terms and definitions shall apply:

The term "data" or as used herein means any indicia, signals, marks, symbols, domains, symbol sets, representations, and any other physical form or forms representing information, whether permanent or temporary, whether visible, audible, acoustic, electric, magnetic, electromagnetic or otherwise manifested. The term "data" as used to represent predetermined information in one physical form shall be deemed to encompass any and all representations of the same predetermined information in a different physical form or forms.

The term "network" as used herein includes both networks and internetworks of all kinds, including the Internet, and is not limited to any particular network or inter-network.

The terms "first" and "second" are used to distinguish one element, set, data, object or thing from another, and are not used to designate relative position or arrangement in time.

The terms "coupled", "coupled to", "coupled with", "connected", "connected to", and "connected with" as used herein each mean a relationship between or among two or more devices, apparatus, files, programs, media, components, networks, systems, subsystems, and/or means, constituting any one or more of (a) a connection, whether direct or through one or more other devices, apparatus, files, programs, media, components, networks, systems, subsystems, or means, (b) a communications relationship, whether direct or through one or more other devices, apparatus, files, programs, media, components, networks, systems, subsystems, or means, and/or (c) a functional relationship in which the operation of any one or more devices, apparatus, files, programs, media, components, networks, systems, subsystems, or means depends, in whole or in part, on the operation of any one or more others thereof.

In one configuration an antenna monitoring unit for use in a distributed antenna system configured to be coupled to a transceiver connected to a building-wide distributed antenna system is provided, the antenna unit comprising an antenna having a resistor connected to ground and a monitoring module. The antenna connects to the monitoring unit through a DC injector including a capacitor having a first side connected to an RF transmission line and a second side connected to the antenna and a first inductor coupled between the resistor and the monitoring module.

In another configuration a method for monitoring an antenna used in a distributed antenna system comprising the steps of connecting an RF path of an antenna to ground through a resistor, connecting the RF path of the antenna to an RF transmission line through a capacitor and connecting a monitoring module to the RF path of the antenna through a first inductor. The method further includes the steps of injecting a DC signal through the inductor to the RF path of the antenna and measuring a resistance of the path of the DC signal. Finally, the method includes the steps of comparing the measured resistance to a stored value and generating a warning if the compared values exceed a threshold level.

In still another configuration in a distributed antenna system including a transceiver connected to a building-wide distributed antenna system having a plurality of antennas, an antenna monitoring unit comprising an antenna and a current injector coupled to the antenna and to an RF transmission line. The antenna monitoring unit is provided such that the antenna is DC isolated from the RF transmission line through the current injector. The antenna monitoring unit further comprises a monitoring module coupled to the current injector. The antenna monitoring unit is provided such that a master controller transmits a DC signal to the monitoring module via the RF transmission line, and the monitoring module compares the DC with saved information to determine if the DC signal matches the saved information and the monitoring module transmits a confirmation signal to the master controller when the DC signal is determined to match the saved information.

Other objects of the invention and its particular features and advantages will become more apparent from consideration of the following drawings and accompanying detailed description.

DETAILED DESCRIPTION

Figure 1:
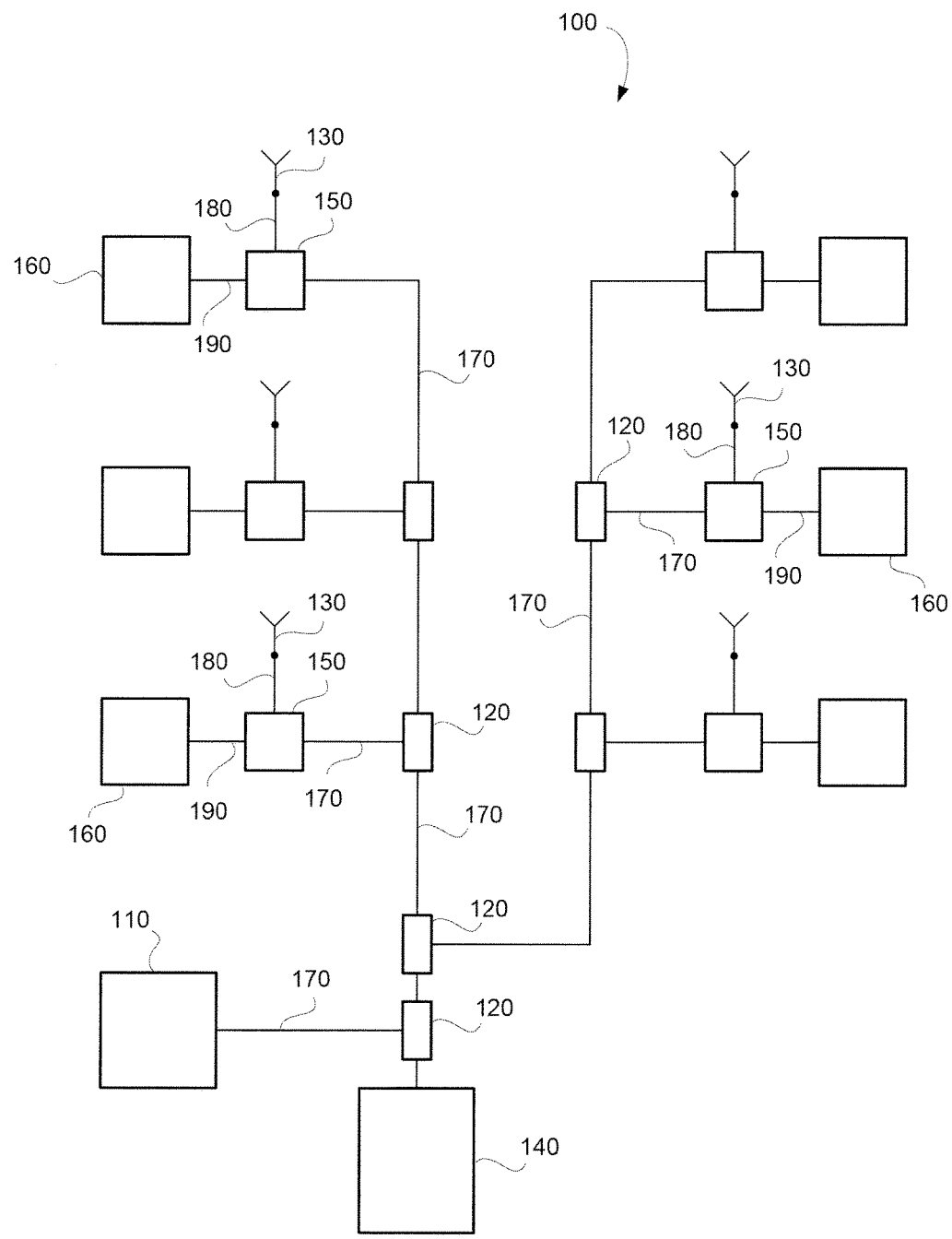
FIG. 1 is a block diagram illustrating a configuration of a distributed antenna system using the inventive antenna connected to a monitoring unit.

Referring now to the drawings, wherein like reference numerals designate corresponding structure throughout the views.

FIG. 1 is a system overview of a Radio Frequency Distributed Antenna System (RF-DAS system) 100.

Figure 8:
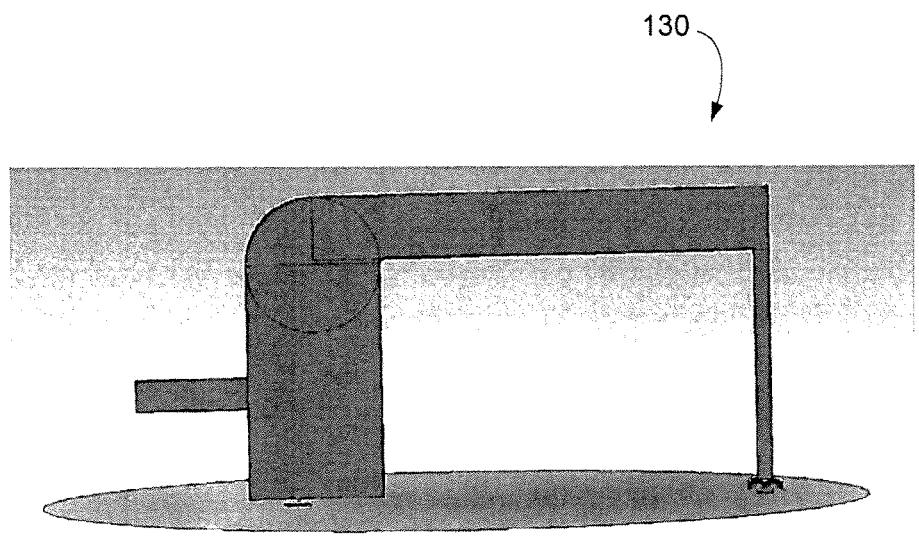
FIG. 8 is a block diagram of the antenna according to FIG. 2.

The system 100 includes an RF signal generator 110, power dividers 120, and antenna units 130. The system further includes a component status monitoring system, which may include a master controller 140 located at a base station, current injectors 150, and monitoring modules 160. The antenna units 130 in the RF-DAS system may comprise inverted F antennas, such as illustrated in FIG. 8. An inverted F antenna is a planar monopole antenna with a shunt.

The RF signal generator 110 functions as a transceiver for the transmission of RF signals along the RF transmission line 170. The power dividers 120 are placed along the RF transmission line and various locations and function to split the RF signal to be transmitted to and from each of the various antenna units 130.

The current injectors 150 are coupled to the RF transmission line 170 and pass the RF signals through to an RF signal path 180 to their associated antenna units 130. The current injectors 150 also include a DC signal path 190 that is provided to transmit DC signals between the master controller 140 and the various monitoring modules 160.

Figure 2:
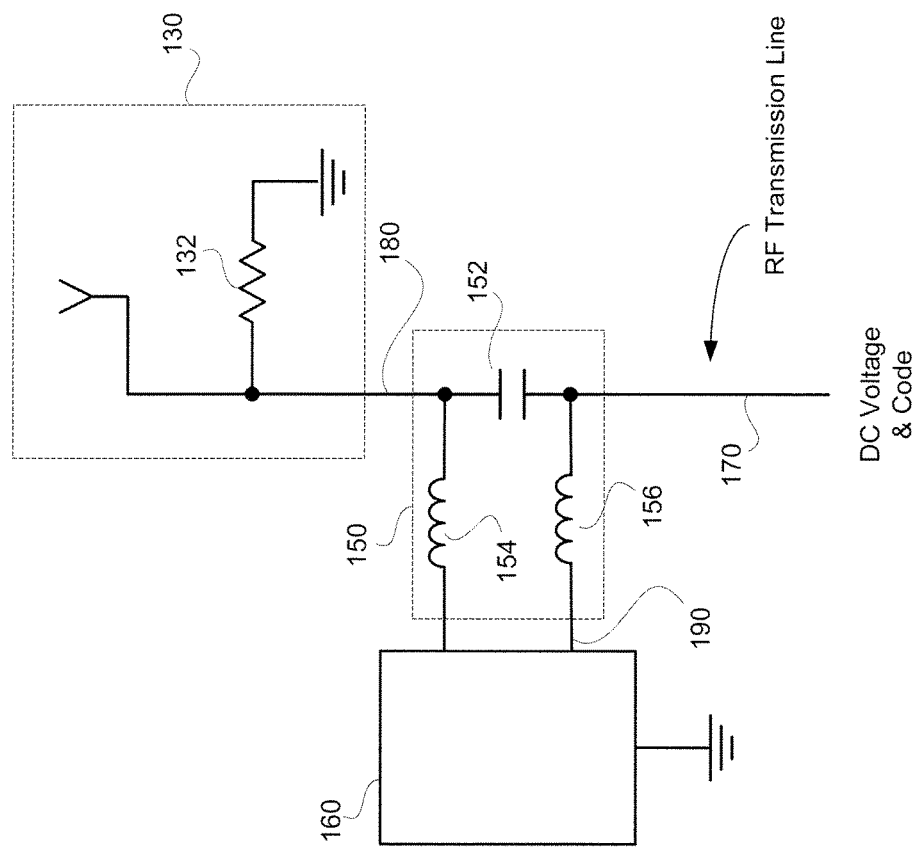
FIG. 2 is a block diagram of the antenna connected to a monitoring unit according to FIG. 1.

A schematic diagram of one configuration of a fault detecting circuit for use in the system of FIG. 1 is illustrated in FIG. 2. FIG. 2 includes the antenna unit 130 that includes a resistance 132 corresponding to the shunt. The antenna unit 130 is coupled to a current injector 150 that includes a capacitance 152 that functions to DC isolate the antenna unit 130 from any DC signal transmitted along the RF transmission line 170.

Current injector 150 further includes an inductance 154, which functions to allow for the injection of a DC signal into antenna unit 130 to determine if antenna unit 130 is currently functional. Additionally, an inductance 156 is provided, which functions to allow for the transmission of DC signals between the master controller 140 along RF transmission line 170, through the current injector 150, along DC signal path 190 and to monitoring module 160.

Figure 7:
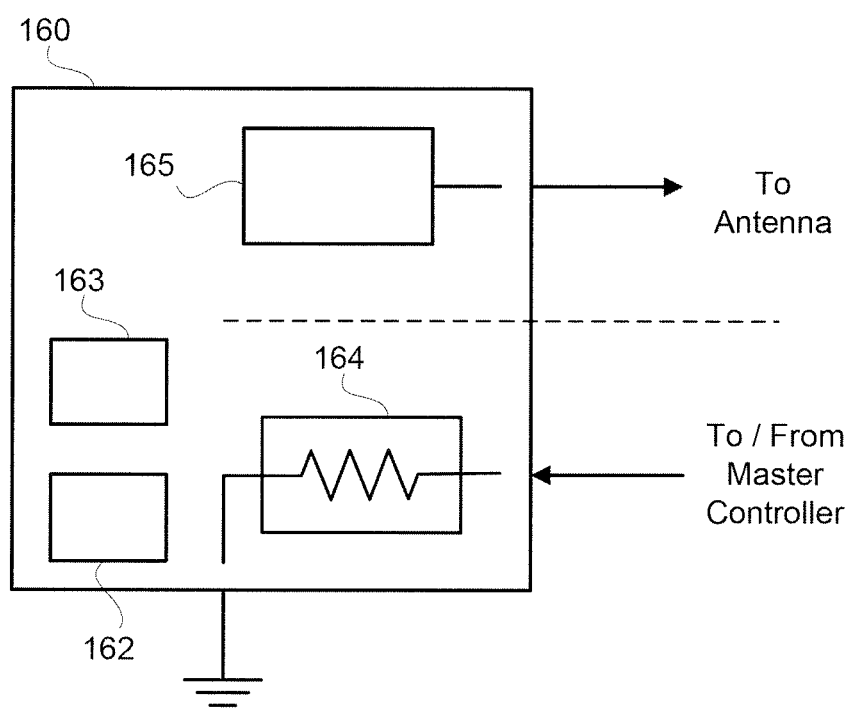
FIG. 7 is a block diagram of the monitoring module according to FIG. 2.

In one configuration, the DC signal comprises a coded signal and the monitoring module 160 includes saved information in a storage 162 (FIG. 7) that identifies the monitoring module 160 from the other monitoring modules connected to the RF transmission line 170. In this manner, a particular monitoring module is able to receive a DC signal that includes a code, compare that received code with the saved information using circuitry 164 to identify that the DC signal is intended for that particular monitoring module 160.

It will be understood by those of skill in the art that the inductance 156 functions to block higher frequency signals but will pass through low frequency DC signals. The inductance 154 functions in the same manner, however, inductance 154 is connected on the other side of capacitance 152 to RF signal path 180 to antenna units 130. The monitoring unit 160 is capable, in one configuration, of injecting a DC signal onto RF signal path 180 to monitor the status of antenna unit 130.

Figure 3A:
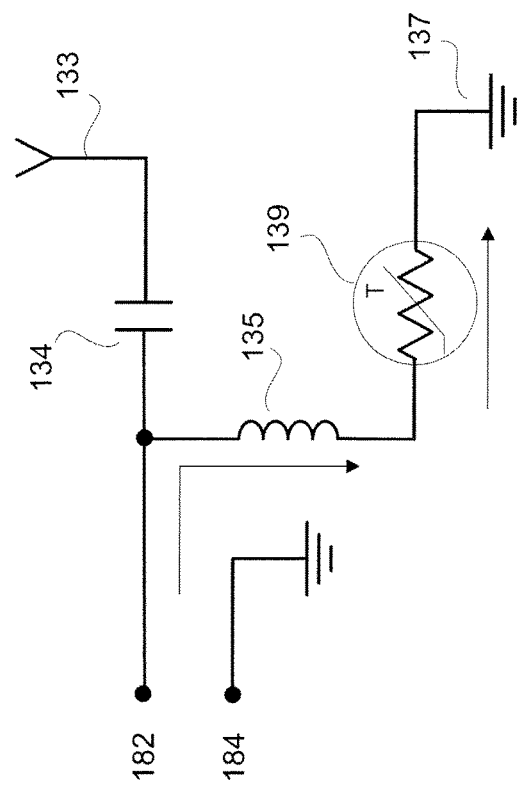
FIG. 3A is a schematic diagram of an alternative design according to FIG. 3.
Figure 3:
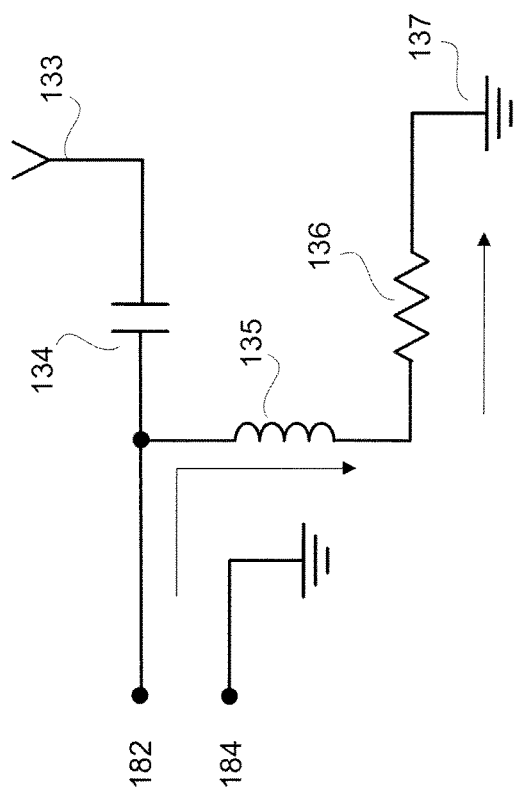
FIG. 3 is a schematic diagram of a DC signal path according to FIG. 2.

FIG. 3 comprises a configuration for testing antenna unit 130. For example, FIG. 3 illustrates antenna 133, capacitor 134, inductor 135, resistor 136 and a ground connection 137. In one embodiment, resistor 136 is 200Ω (ohms) and is positioned in series with inductor 135 with a value of 300 nH (nano Henrys). Inductor 135 and resistor 136 are connected in series with each other between the positive conductor 182 of RF signal path 180 and ground connection 137 to which the negative conductor 184 of RF signal path 180 is also connected. Capacitor 134 has a value of 300 pF (pico Farads).

This component circuit provides a DC resistance of 200Ω at DC and very low frequencies. The impedance, however, becomes a virtual short circuit above 200 MHz. Therefore, an inverted F antenna (FIG. 8) is able to function as if the small component network was nonexistent.

Referring now to FIG. 3A, a variant circuit is illustrated in which resistor 136 is replaced with thermistor 139. In this configuration, thermistor 139 is placed in close vicinity to antenna 133 and is used to sense changes in temperature, such that, the complete system can be monitored for 'hot spots.' In such case, remote monitoring of the cabling and antenna could further include, an ambient temperature measurement of the area in the vicinity of the antenna. This embodiment could further include a threshold alarm setting, warning of dangerous temperature levels in the building, possibly adding early fire detection and warning.

In the above-described configuration, it is contemplated that the master controller 140 supplies a DC voltage having a low frequency (i.e., 9 kHz) coded square wave signal. The square wave signal is separated from the RF transmission line 170 by current injector 150. Current injector 150 forwards the DC signal to the monitoring module 160. The monitoring module 160, if it recognizes the coded square wave signal will transmit a confirming DC signal verifying the status of the RF transmission line 170. In one simple arrangement, the monitoring module 160 may simply DC switch the connection to the RF transmission line and/or direct the coded square wave signal back to the master controller 140. The monitoring module 160 may include a microprocessor 163 to allow signaling with an addressable memory to store information in storage 162.

Figure 4:
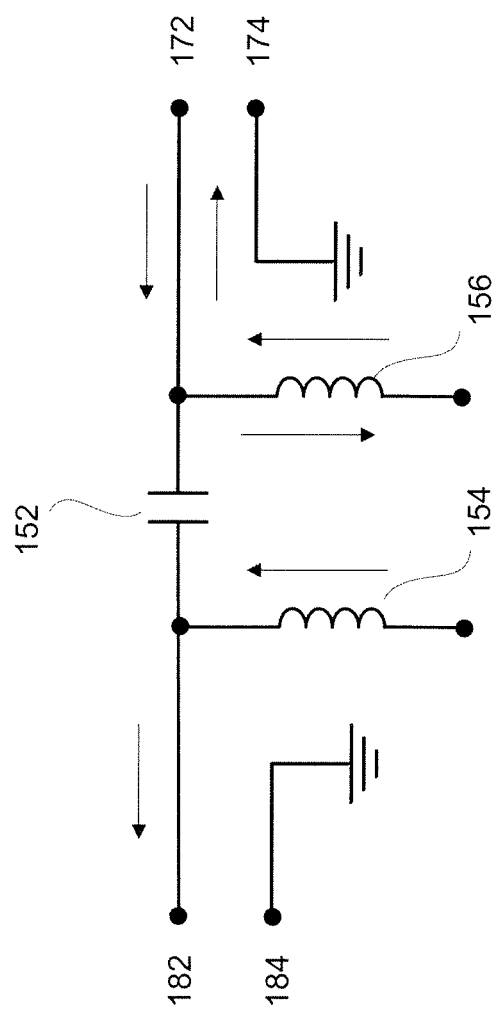
FIG. 4 is a schematic diagram of various DC signal paths according to FIG. 2.

FIG. 4 is an example of the DC injector that injects the DC signal according to one embodiment of the current invention. On one side of capacitor 152, arrows indicate an incoming signal (from master controller 140) received on RF transmission line 170 (172, 174) that is transmitted through inductor 156. Also shown are arrows indicating an outgoing signal (to master controller 140) that may comprise any of the types of signals described above.

On the other side of capacitor 152, arrows indicate an outgoing signal (from monitoring module 160) that travel toward antenna unit 130 where a value (such as resistance, or voltage or current) can be measured to determine if the RF signal path 180 (182, 184) is valid and/or provide temperature data per the embodiment of FIG. 3A.

Figure 5:
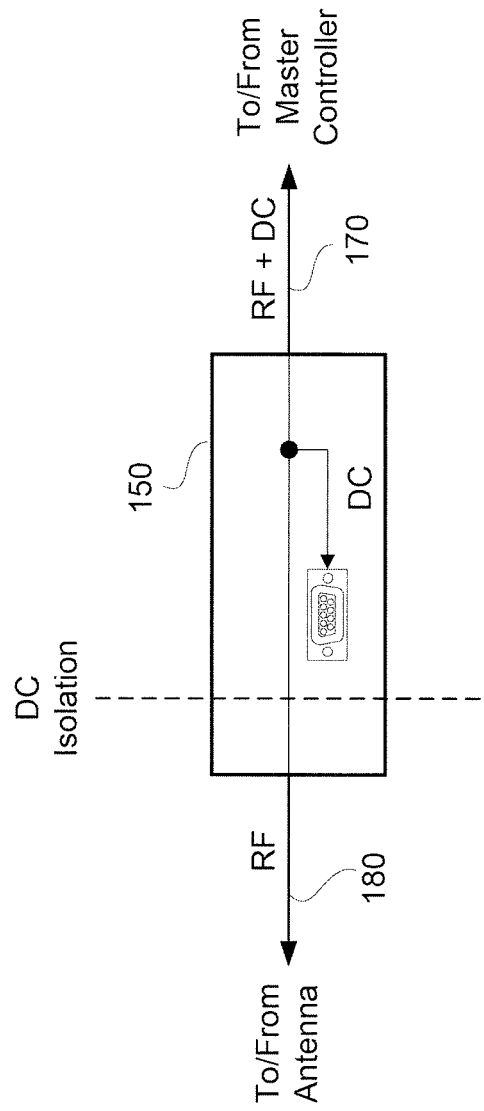
FIG. 5 is an illustration of the DC injector according to one configuration of FIG. 2.
Figure 6:
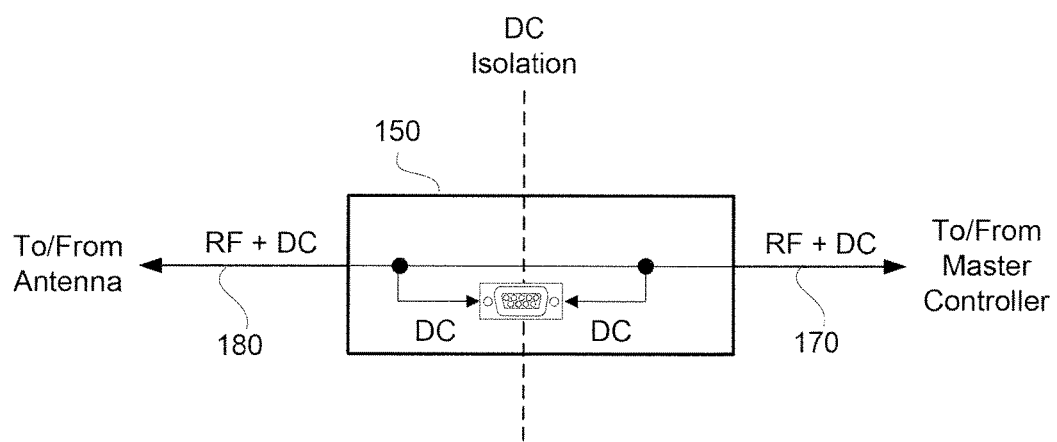
FIG. 6 is an illustration of the DC injector according to another configuration of FIG. 2.

FIGS. 5 and 6 illustrate two different configurations for current injector 150. In FIG. 5, the device is configured to allow for a DC signal to be transmitted on RF transmission line 170, but blocks any DC signal from reaching antenna unit 130. Alternatively, FIG. 6 allows for a DC signal to be sent on both RF transmission line 170 and RF signal path 180. Each of these will be discussed in further detail below.

Antenna.

The antenna 133 in one form is monitored with a current loop and is capable of providing analog signals to a monitoring device including a constant resistance to prove the antenna is in place and ready to function or a variable resistance depicting a value which could relate to ambient temperature, RF signal level, or any variable the internal circuitry was designed to relay. In another form, the antenna could incorporate a microprocessor that could process information within the antenna and disseminate that information as it is processed or in response to a polling request triggered by the monitoring system. Referring to FIG. 1, a current injector 150 is placed at each antenna unit 130 location and provides the monitoring module 160 with a continuous DC path to the master controller 140 and an isolated DC path to the antenna unit 130 (isolated DC paths on each connector of the current injector 150). This allows monitoring of the antenna unit 130 itself. The monitoring module 160 may optionally be provided with a power source 165 (or with an external power source) that provides DC voltage and enough current to manage this feature. The current injector 150 and the monitoring module 160 are designed to allow for this feature. The antenna is designed for whatever operational RF band it is expected to operate within and as such, is available in various models. A broadband model is available, for example, where the UHF "public safety" band as well as all popular cellular bands from 700 MHz through 2700 MHz and above are effectively managed through a single radiating element. The components within the antenna itself responsible for the monitoring capability are not affected by the operational bandwidth of the radiating element of the antenna. Therefore, the invention can be incorporated into antennas designed for in-building DAS applications or any other RF antenna such as base station antennas, specialty applications, etc.

Power Divider.

A reactive power divider 120 allows a DC path through all ports and provides equal 2-way, 3-way, and 4-way divisions typically (2-way dividers shown in FIG. 1). A reactive power divider 120 is a non-directional coaxial structure available in a variety of coupled values, which enables the RF system designer to balance the various antenna lines having differing lengths and to be able to split the power from main lines to branch lines to divide the power as needed. A reactive power divider 120 for this application may have the following attributes:

Parameter Specification Comments
RF Passband freq. 376-2,200 MHz
Passband insertion loss 0.15 dB Max
Return loss>18 dB Measured at input
RF power handling 100 W
PIMD IM3>155 dBc 2×20 W tones @ 850 MHz
DC PASS yes All ports to all ports
DC Voltage 3V-36V
DC Current 2 A @ 36 VDC
Connectors N Type Female
Coupling values 3, 4.8, 6 dB (2, 3, 4 way splits)
Operating Temp 0 C-45 C Current Injector The current injector 150 (shown in FIG. 5) is a bi-directional coaxial structure for RF power while allowing DC current to be placed on the coaxial line in one direction and blocking that DC current in the other direction. Blocking the DC in one direction protects circuits on the blocked side from being DC energized to prevent a shock hazard or the possibility of that DC current damaging a radio for example.

It should be noted, however, that this configuration does not allow the antenna unit 130 direct monitoring feature.

Parameter Specification Comments
RF Passband freq. 350-960 MHz
Passband insertion loss 0.2 dB Max
Return loss>18 dB S11 and S22
RF power handling 100 W
PIMD IM3>150 dBc 2×10 W tones @ 850 MHz
DC PASS yes
DC Voltage 3V-36V
DC Current 2 A @ 36 VDC
Connectors N Type Female DB9 for DC path
Operating Temp 0 C-45 C Current Injector Allowing Direct Antenna Monitoring.

While similar to the current injector shown in FIG. 5, the unit shown in FIG. 6 permits monitoring the antenna directly. Current injector 150 comprises a second injector that is connected to the antenna unit 130, allowing an isolated DC path between the antenna and the monitoring unit. This configuration allows the antenna monitoring unit to be powered and polled by a DC current supplied elsewhere in the building such as at the master controller location as well as supply an isolated DC path directly into the antenna the monitoring unit is monitoring. This configuration negates the need for locally powering each antenna location which can be a real challenge in many installations.

Master Controller.

The master controller 140 communicates with the monitoring modules 160 placed at each antenna unit 130 location. The master controller 140 supplies a DC current to each of the monitoring modules 160, polls the monitoring modules 160 to ensure they are still part of the RF transmission line 170 and provides information on the health of the system to an alarm monitoring center over a system wide network connection. Each monitoring module 160 can include a unique address within the network of remote monitoring modules that may be managed by master controller 140.

Monitoring Module.

Each monitoring module 160 is a part of the system that communicates uniquely with master controller 140. The monitoring module 160, in this example, is fed DC current from the master controller 140 and has an address that the master controller 140 recognizes as associated with an antenna unit 130 position/physical location within the building. This could be accomplished, for example, by using a lookup table or other dataset system. The monitoring module 160 is located as close as practically possible to the antenna thereby monitoring the entire RF transmission line 170 and the RF signal path 180 directly into the antenna 133.

Figure 9:
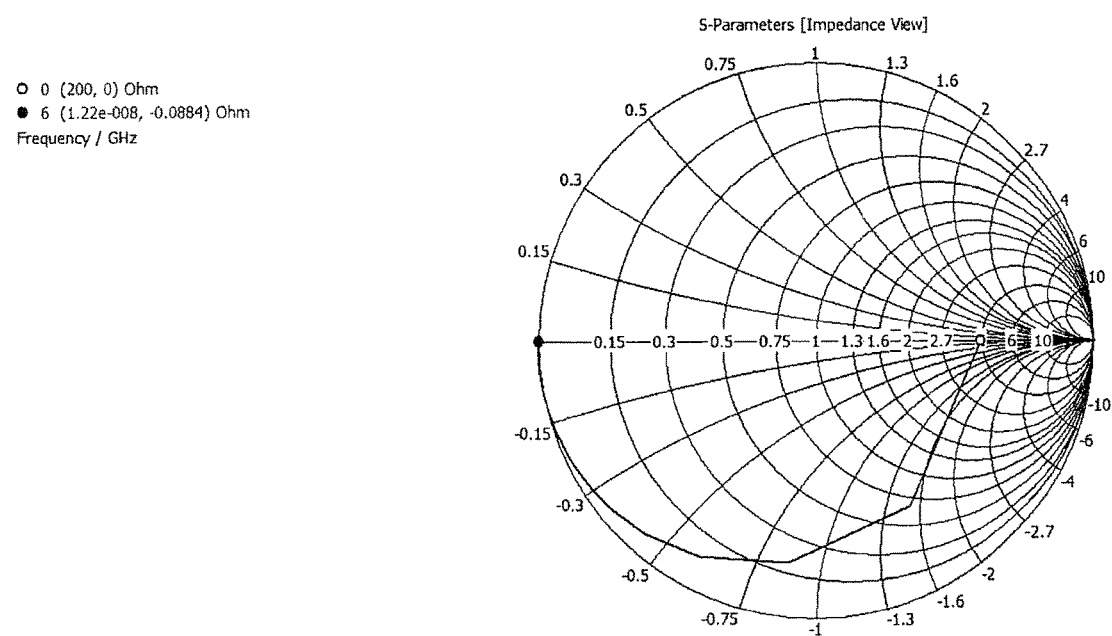
FIG. 9 is a Smith diagram of the antenna according to FIG. 8.

FIG. 9 is an Impedance View Smith Chart showing that the impedance of the fault detection circuit becomes a virtual short circuit to signal frequencies above 200 MHz, so that the antenna is able to function as if the small component network were not present.

Although the invention has been described with reference to a particular arrangement of parts, features and the like, these are not intended to exhaust all possible arrangements or features, and indeed many other modifications and variations will be ascertainable to those of skill in the art.

What is claimed is:

1. A system for remote monitoring a network of distributed antennas, comprising:
   at least one antenna electrically coupled to a radio-frequency (RF) transmission line;
   a monitoring module electrically coupled to the RF transmission line, the monitoring module configured to receive a direct-current (DC) coded signal via the RF transmission line and compare the DC coded signal to at least one code saved in a memory of the monitoring module to determine a status associated with the at least one antenna; and
   a DC master controller configured to supply the DC coded signal to the monitoring module, poll the monitoring module, and generate information concerning system health.

2. The system of claim 1, further comprising:
   a transceiver electrically coupled to the RF transmission line, wherein the monitoring module is configured to transmit a confirmation signal along the RF transmission line to the transceiver upon selective determination that the DC coded signal matches the at least one code.

3. The system of claim 1, further comprising:
   a second monitoring module, and wherein the at least one antenna includes a second antenna, the second antenna and the second monitoring module being electrically coupled to the RF transmission line and the second monitoring module being configured to receive the DC coded signal via the RF transmission line and compare the DC coded signal to at least one further code saved in a memory of the monitoring module to determine a further status associated with the second antenna.

4. The system of claim 1, wherein the monitoring module is configured to selectively send a text or email message to a concerned party regarding the status associated with the at least one antenna.

5. The system of claim 1, wherein the at least one antenna comprises a plurality of antennas.

6. The system of claim 5, wherein the plurality of antennas is arranged as a building-wide distributed antenna system.

* * * * *